United States Patent
Chi

(10) Patent No.: US 11,415,665 B2
(45) Date of Patent: Aug. 16, 2022

(54) ULTRA-WIDEBAND RADAR TRANSCEIVER AND OPERATING METHOD THEREOF

(71) Applicant: RichWave Technology Corp., Taipei (TW)

(72) Inventor: Hsiang-Feng Chi, Taipei (TW)

(73) Assignee: RichWave Technology Corp., Taipei (TW)

(*) Notice: Subject to any disclaimer, the term of this patent is extended or adjusted under 35 U.S.C. 154(b) by 460 days.

(21) Appl. No.: 16/575,403

(22) Filed: Sep. 19, 2019

(65) Prior Publication Data

US 2020/0150223 A1 May 14, 2020

(30) Foreign Application Priority Data

Nov. 8, 2018 (TW) .................................. 107139726

(51) Int. Cl.
*G01S 7/35* (2006.01)
*G01S 13/02* (2006.01)
*H03M 1/12* (2006.01)

(52) U.S. Cl.
CPC .......... *G01S 7/354* (2013.01); *G01S 13/0209* (2013.01); *G01S 7/358* (2021.05); *H03M 1/12* (2013.01)

(58) Field of Classification Search
CPC ...... G01S 7/354; G01S 7/032; G01S 13/0209; G01S 13/103; G01S 13/18; G01S 13/30;
(Continued)

(56) References Cited

U.S. PATENT DOCUMENTS 6,867,727 B1  3/2005 Mitra
7,508,860 B2 * 3/2009 Hyun .................. H04B 1/7174
                                                    375/348
(Continued)

FOREIGN PATENT DOCUMENTS

CN        1298107       6/2001
CN      101022280       8/2007
(Continued)

OTHER PUBLICATIONS

"Search Report of Europe Counterpart Application", dated Apr. 6, 2020, p. 1-p. 10.

*Primary Examiner* — Vladimir Magloire
*Assistant Examiner* — Oladimeji Oyegunle
(74) *Attorney, Agent, or Firm* — JCIPRNET

(57) ABSTRACT

An ultra-wideband radar transceiver and an operating method thereof are provided. The ultra-wideband radar transceiver includes a receiving module. The receiving module includes an I/Q signal generator, a first sensing circuit and a second sensing circuit. The I/Q signal generator receives M consecutive echo signals and generates M consecutive in-phase signals and M consecutive quadrature-phase signals accordingly, wherein M is an integer greater than 1. The first sensing circuit is coupled to the I/Q signal generator to receive the M consecutive in-phase signals and is configured to perform integration and analog-to-digital conversion on the M consecutive in-phase signals to generate a first digital data. The second sensing circuit is coupled to the I/Q signal generator to receive the M consecutive quadrature-phase signals and is configured to perform integration and analog-to-digital conversion on the M consecutive quadrature-phase signals to generate a second digital data.

16 Claims, 11 Drawing Sheets

(58) Field of Classification Search
CPC .......... G01S 7/282; G01S 7/285; G01S 7/288; G01S 7/2886; G01S 7/2926; G01S 7/358; H03M 1/12
See application file for complete search history.

(56) References Cited

U.S. PATENT DOCUMENTS

| | | | |
|---|---|---|---|
| 8,564,358 | B2 | 10/2013 | Masson |
| 2005/0156780 | A1 | 7/2005 | Bonthron et al. |
| 2016/0219544 | A1 | 7/2016 | Park |
| 2019/0215030 | A1* | 7/2019 | Nabki .................. H04B 1/10 |

FOREIGN PATENT DOCUMENTS

| | | |
|---|---|---|
| CN | 201855272 | 6/2011 |
| CN | 102317809 | 1/2012 |
| CN | 103389492 | 11/2013 |
| CN | 103562744 | 9/2016 |
| CN | 106506038 | 10/2018 |
| EP | 1082621 | 10/2005 |
| EP | 1703298 | 9/2006 |
| EP | 1986020 | 10/2014 |
| TW | I398107 | 6/2013 |
| TW | 201616152 | 5/2016 |
| TW | 201721094 | 6/2017 |

* cited by examiner

ULTRA-WIDEBAND RADAR TRANSCEIVER AND OPERATING METHOD THEREOF

CROSS-REFERENCE TO RELATED APPLICATION

This application claims the priority benefit of Taiwan application serial no. 107139726, filed on Nov. 8, 2018. The entirety of the above-mentioned patent application is hereby incorporated by reference herein and made a part of this specification.

BACKGROUND

Technical Field

The disclosure relates to a radar technology, and more particularly to an ultra-wideband radar transceiver and an operating method thereof.

Description of Related Art

Ultra-wideband radars have the characteristics of extremely wide bandwidth, which may detect short-distance objects by transmitting pulse signals and receiving echo signals. Since a pulse width of the pulse signal transmitted by the ultra-wideband radar and a pulse width of the received echo signal are extremely small, it is difficult for the echo signals to be digitized to perform subsequent digital signal processing. Generally, an extremely high-speed analog-to-digital converter may be configured in an ultra-wideband radar to digitize the echo signals. However, extremely high-speed analog-to-digital converters not only consume power, but also increase the hardware costs of ultra-wideband radars.

SUMMARY

In view of this, the disclosure provides an ultra-wideband radar transceiver and an operating method thereof, which may effectively reduce the difficulty of digitizing an echo signal.

The ultra-wideband radar transceiver of the disclosure is configured to detect spatial information within a specific distance range. The ultra-wideband radar transceiver includes a receiving module. The receiving module is configured to receive M consecutive echo signals and respectively generate a first digital data and a second digital data accordingly, where M is an integer greater than 1. The receiving module includes an I/Q signal generator, a first sensing circuit, and a second sensing circuit. The I/Q signal generator is configured to generate M consecutive in-phase signals and M consecutive quadrature-phase signals according to the M consecutive echo signals. The first sensing circuit is coupled to the I/Q signal generator to receive the M consecutive in-phase signals and configured to perform integration and an analog-to-digital conversion on the M consecutive in-phase signals to generate the first digital data. The second sensing circuit is coupled to the I/Q signal generator to receive the M consecutive quadrature-phase signals, and configured to perform integration and an analog-to-digital conversion on the M consecutive quadrature-phase signals to generate the second digital data. The first sensing circuit includes a first integrator circuit, a first low-pass filter circuit, and a first analog-to-digital conversion circuit. The first integrator circuit is configured to perform integration on the M consecutive in-phase signals to respectively generate M consecutive first integrated signals. The first low-pass filter circuit is coupled to the first integrator circuit to receive the M consecutive first integrated signals and performs low-pass filtering and signal accumulation on the M consecutive first integrated signals to generate a first filtered signal. The first analog-to-digital conversion circuit is coupled to the first low-pass filter circuit to receive the first filtered signal and performs an analog-to-digital conversion on the first filtered signal to generate the first digital data. The second sensing circuit includes a second integrator circuit, a second low-pass filter circuit, and a second analog-to-digital conversion circuit. The second integrator circuit is configured to perform integration on the M consecutive quadrature-phase signals to respectively generate M consecutive second integrated signals. The second low-pass filter circuit is coupled to the second integrator circuit to receive the M consecutive second integrated signals and performs low-pass filtering and signal accumulation on the M consecutive second integrated signals to generate a second filtered signal. The second analog-to-digital conversion circuit is coupled to the second low-pass filter circuit to receive the second filtered signal and performs an analog-to-digital conversion on the second filtered signal to generate the second digital data. The first digital data and the second digital data are related to the spatial information.

The operating method of the ultra-wideband radar transceiver of the disclosure is configured to detect spatial information within a specific distance range. This operating method includes the following steps. M consecutive echo signals are received, and M consecutive in-phase signals and M consecutive quadrature-phase signals are generated according to M consecutive echo signals. Integration is performed on the M consecutive in-phase signals to respectively generate M consecutive first integrated signals, and integration is performed on the M consecutive quadrature-phase signals to respectively generate M consecutive second integrated signals. Low-pass filtering and signal accumulation are performed on the M consecutive first integrated signals to generate a first filtered signal, and low-pass filtering and signal accumulation are performed on the M consecutive second integrated signals to generate a second filtered signal. An analog-to-digital conversion is performed on the first filtered signal to generate a first digital data, and an analog-to-digital conversion is performed on the second filtered signal to generate a second digital data, where M is an integer greater than 1. The first digital data and the second digital data are related to the spatial information.

In order to make the above-described features of the disclosure more comprehensible, the following detailed description of the embodiments will be described in detail below.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, explain the principles of the disclosure.

DESCRIPTION OF THE EMBODIMENTS

Figure 1:
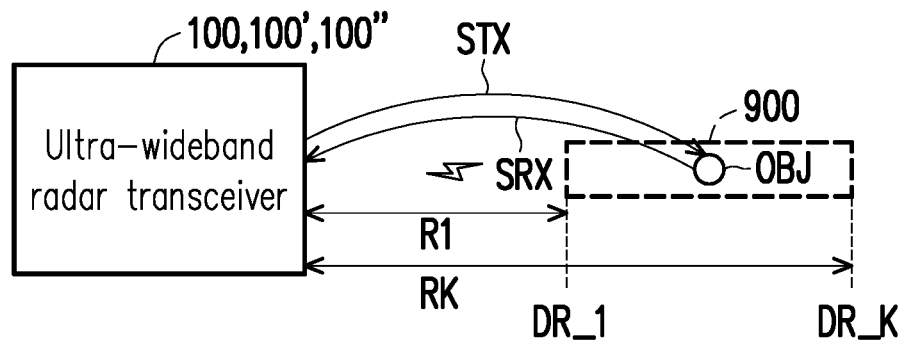
FIG. 1 is a schematic diagram of detection operation of an ultra-wideband radar transceiver according to an embodiment of the disclosure.

In order to make the content of the disclosure easier to understand, the following specific embodiments are examples of the disclosure that may be implemented. In addition, wherever possible, the same reference numerals are used in the figures and embodiments to represent the same or similar parts.

Figure 2:
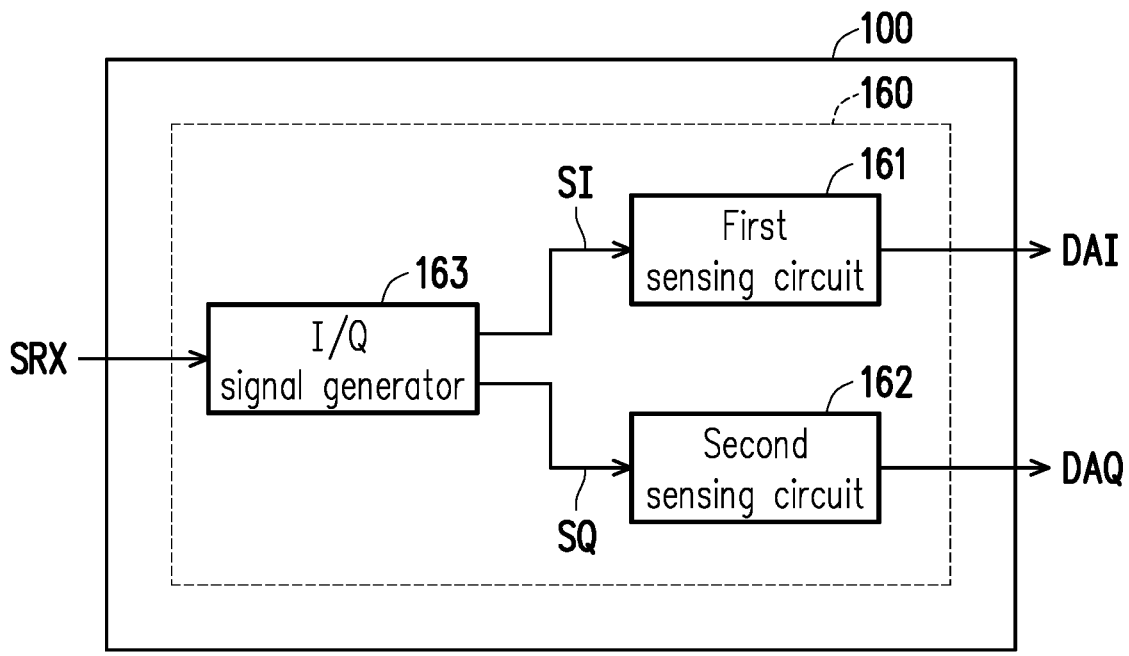
FIG. 2 is a circuit block diagram of an ultra-wideband radar transceiver according to an embodiment of the disclosure.

FIG. 1 is a schematic diagram of detection operation of an ultra-wideband radar transceiver according to an embodiment of the disclosure, and FIG. 2 is a circuit block diagram of an ultra-wideband radar transceiver according to an embodiment of the disclosure. Referring to FIG. 1 and FIG. 2 together, the ultra-wideband radar transceiver 100 may be configured to detect spatial information within a specific distance range 900, such as the spatial information between the distance location DR_1 and the distance location DR_K shown in FIG. 1, in which the distance from the ultra-wideband radar transceiver 100 to the distance location DR_1 is R1, and the distance from the ultra-wideband radar transceiver 100 to the distance location DR_K is RK. The ultra-wideband radar transceiver 100 may perform consecutive multiple sensing operations for each distance location DR_1~DR_K within a specific distance range 900 to obtain a first digital data and a second digital data corresponding to each distance location DR_1~DR_K. The first digital data and the second digital data are related to the spatial information.

The ultra-wideband radar transceiver 100 may include a receiving module 160, but the disclosure is not limited thereto. The receiving module 160 is configured to receive M consecutive echo signals SRX, and accordingly generate the first digital data DAI and the second digital data DAQ, where M is an integer greater than 1. In detail, the receiving module 160 includes an I/Q signal generator 163, a first sensing circuit 161, and a second sensing circuit 162. The I/Q signal generator 163 is configured to generate M consecutive in-phase signals SI and M consecutive quadrature-phase signals SQ according to the M consecutive echo signals SRX. The first sensing circuit 161 is coupled to the I/Q signal generator 163 to receive the M consecutive in-phase signals SI and configured to perform integration and an analog-to-digital conversion on the M consecutive in-phase signals SI to generate the first digital data DAI. The second sensing circuit 162 is coupled to the I/Q signal generator 163 to the receive M consecutive quadrature-phase signals SQ and configured to perform integration and an analog-to-digital conversion on the M consecutive quadrature-phase signals SQ to generate the second digital data DAQ. In an embodiment of the disclosure, "continuous" or "consecutive" does not mean uninterrupted, just that it is continuous for a long enough time period.

In an embodiment of the disclosure, the M consecutive echo signals SRX may be, for example, M consecutive signals which are M consecutive pulse signals STX transmitted by the ultra-wideband radar transceiver 100 respectively varied in space. For example, the M consecutive pulse signals STX are respectively reflected by an object OBJ in space to generate the M consecutive echo signals SRX, and the spatial information may be, for example, the displacement amount of the object OBJ, but the disclosure is not limited thereto. In another embodiment of the disclosure, the M consecutive echo signals SRX may be, for example, M consecutive signals which are M consecutive pulse signals transmitted by another ultra-wideband radar transceiver respectively varied in space, wherein the space includes the specific distance range 900.

In an embodiment of the disclosure, the I/Q signal generator 163 may include a low noise amplifier (LNA) circuit and a down-conversion mixer (not shown). The low noise amplifier circuit may be configured to amplify the echo signal SRX. The down-conversion mixer may perform a frequency conversion to convert the amplified echo signal into a low frequency in-phase signal SI and a quadrature-phase signal SQ. This will be explained in detail later.

Figure 3A:
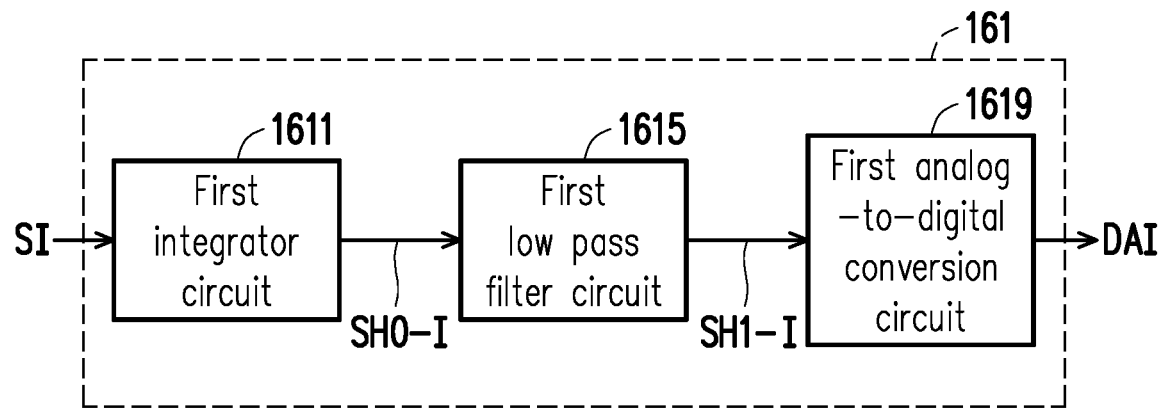
FIG. 3A is a circuit block diagram of a first sensing circuit according to an embodiment of the disclosure.

FIG. 3A is a circuit block diagram of a first sensing circuit according to an embodiment of the disclosure. As shown in FIG. 3A, the first sensing circuit 161 includes a first integrator circuit 1611, a first low-pass filter circuit 1615, and a first analog-to-digital conversion circuit 1619. The first integrator circuit 1611 is configured to perform integration on the M consecutive in-phase signals SI to respectively generate M consecutive first integrated signals SH0-I. The first low-pass filter circuit 1615 is coupled to the first integrator circuit 1611 to receive the M consecutive first integrated signals SH0-I, and performs low-pass filtering and signal accumulation on the M consecutive first integrated signals SH0-I to generate a first filtered signal SH1-I. The first analog-to-digital conversion circuit 1619 is coupled to the first low-pass filter circuit 1615 to receive the first filtered signal SH1-I and performs an analog-to-digital conversion on the first filtered signal SH1-I to generate a first digital data DAI.

Figure 3B:
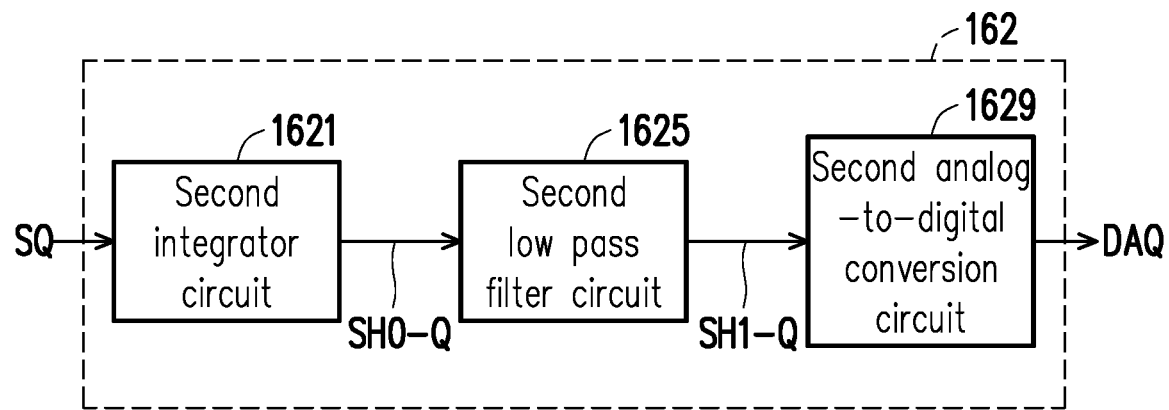
FIG. 3B is a circuit block diagram of a second sensing circuit according to an embodiment of the disclosure.

FIG. 3B is a circuit block diagram of a second sensing circuit according to an embodiment of the disclosure. As shown in FIG. 3B, the second sensing circuit 162 includes a second integrator circuit 1621, a second low-pass filter circuit 1625, and a second analog-to-digital conversion circuit 1629. The second integrator circuit 1621 is configured to perform integration on the M consecutive quadrature-phase signals SQ to generate M consecutive second integrated signals SH0-Q. The second low-pass filter circuit 1625 is coupled to the second integrator circuit 1621 to receive the M consecutive second integrated signals SH0-Q, and performs low-pass filtering and signal accumulation on the M consecutive second integrated signals SH0-Q to generate a second filtered signal SH1-Q. The second analog-to-digital conversion circuit 1629 is coupled to the second low-pass filter circuit 1625 to receive the second filtered signal SH1-Q and performs an analog-to-digital conversion on the second filtered signal SH1-Q to generate a second digital data DAQ. The first low-pass filter circuit 1615 and the second low-pass filter circuit 1625 are, for example, an active or passive switch capacitor circuit.

Figure 3C:
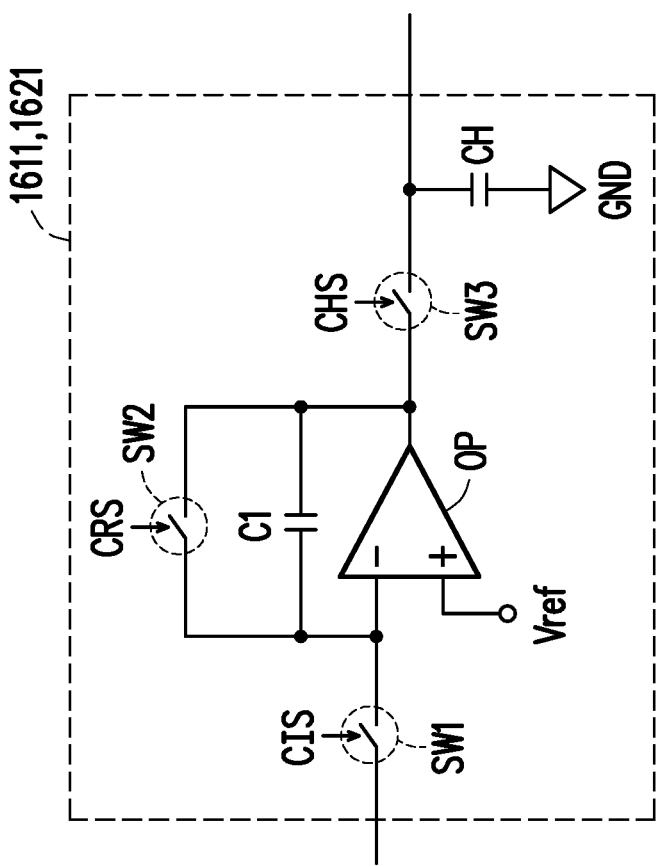
FIG. 3C is a schematic diagram of a circuit architecture of a first integrator circuit and a second integrator circuit according to an embodiment of the disclosure.

In an embodiment of the disclosure, the first integrator circuit 1611 and the second integrator circuit 1621 may be implemented by using an integrator circuit as shown in FIG. 3C but are not limited thereto. Please refer to FIG. 3A to FIG. 3C together. The first integrator circuit 1611 or the second integrator circuit 1621 includes switches SW1, SW2 and SW3, capacitors C1 and CH, and an operational amplifier OP. The non-inverting input terminal of the operational amplifier OP receives the reference voltage Vref. The first terminal of the switch SW1 is configured to receive the in-phase signals SI or the quadrature-phase signals SQ. The second terminal of the switch SW1 is coupled to the inverting input terminal of the operational amplifier OP. The control terminal of the switch SW1 receives the integral control signal CIS. The first terminal of the switch SW2 is coupled to the inverting input terminal of the operational amplifier OP. The second terminal of the switch SW2 is coupled to the output terminal of the operational amplifier OP. The control terminal of the switch SW2 receives the reset control signal CRS. The first terminal of the capacitor C1 is coupled to the inverting input terminal of the operational amplifier OP. The second terminal of the capacitor C1 is coupled to the output terminal of the operational amplifier OP. The first terminal of the switch SW3 is coupled to the output terminal of the operational amplifier OP. The second terminal of the switch SW3 outputs the first integrated signal SH0-I or the second integrated signal SH0-Q. The control terminal of the switch SW3 receives the hold control signal CHS. The first terminal of the capacitor CH is coupled to the second terminal of the switch SW3. The second terminal of the capacitor CH is coupled to a common terminal, such as the ground voltage terminal GND.

In an embodiment of the disclosure, the first analog-to-digital conversion circuit 1619 and the second analog-to-digital conversion circuit 1629 may be implemented by using an existing analog-to-digital conversion circuit but are not limited thereto. In addition, embodiments of the first low-pass filter circuit 1615 and the second low-pass filter circuit 1625 will be described in detail later.

In an embodiment of the disclosure, the M consecutive in-phase signals SI and the M consecutive quadrature-phase signals SQ respectively integrated by the first integrator circuit 1611 and the second integrator circuit 1621 are corresponding to one of the distance locations within the specified distance range 900 shown in FIG. 1, such as the distance location DR_1. Therefore, based on the first digital data DAI obtained from performing the integration and the analog-to-digital conversion on the M consecutive in-phase signals SI, and based on the second digital data DAQ obtained from performing the integration and the analog-to-digital conversion on the M consecutive quadrature-phase signals SQ, the spatial information of the distance location DR_1 may be detected, which will be described later.

It is worth mentioning that comparing to an analog-to-digital conversion directly performed using an extremely high-speed analog-to-digital converter on a single in-phase signal (or a single quadrature-phase signal), in the embodiment of the disclosure, by performing integration, low-pass filtering and signal accumulation on the M consecutive in-phase signals SI, and by performing integration, low-pass filtering and signal accumulation on the M consecutive quadrature-phase signals SQ, and then respectively converting to the first digital data DAI and the second digital data DAQ by the analog-to-digital conversion circuit, the difficulty of digitizing the echo signal may be effectively reduced, power consumption and cost associated with the use of extremely high-speed analog-to-digital converters may be reduced, and the noises in the signal provided to the analog-to-digital converter is also reduced by low-pass filtering and continuous signal accumulation.

Figure 4A:
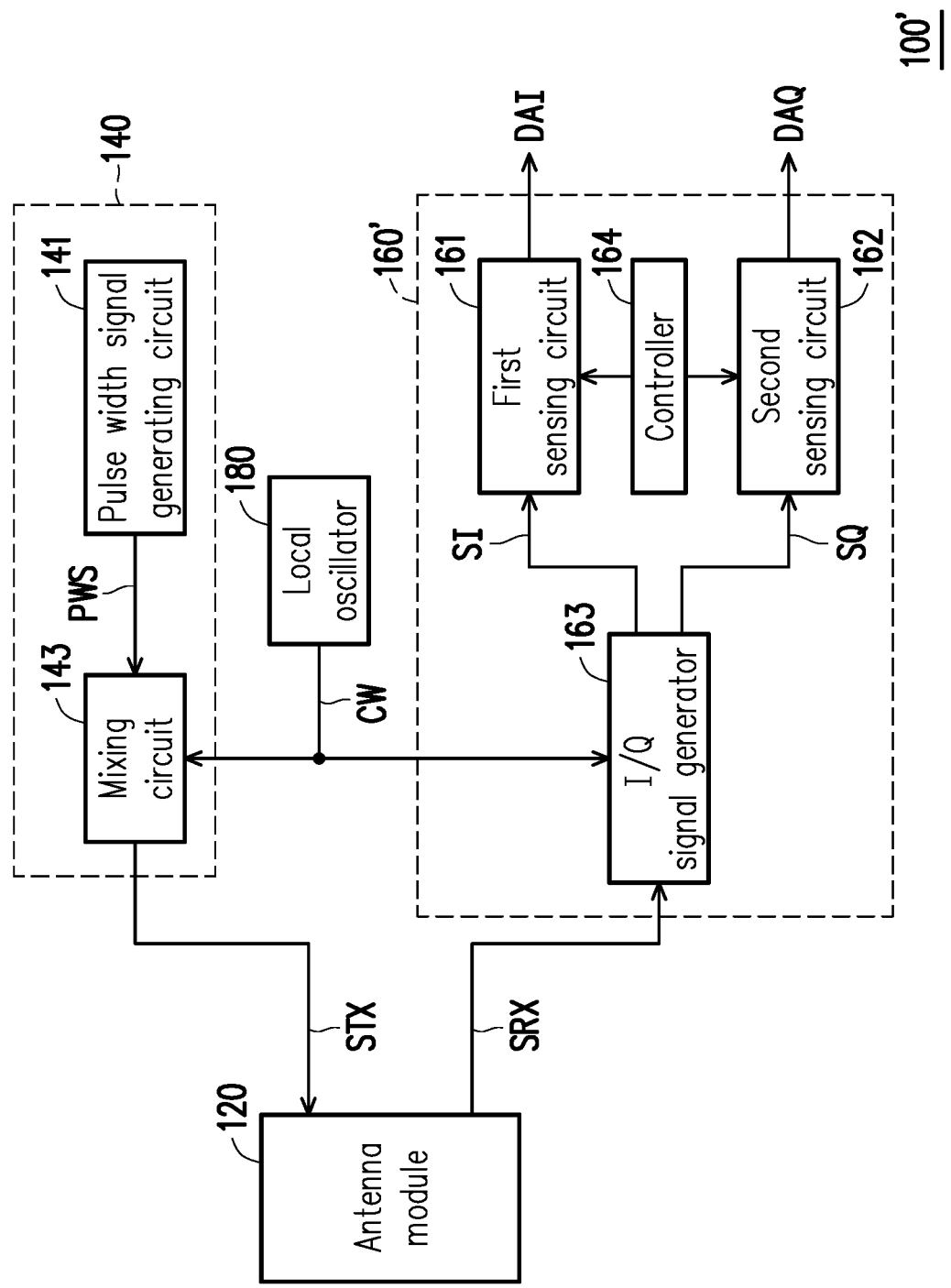
FIG. 4A is a circuit block diagram of an ultra-wideband radar transceiver according to another embodiment of the disclosure.
Figure 4B:
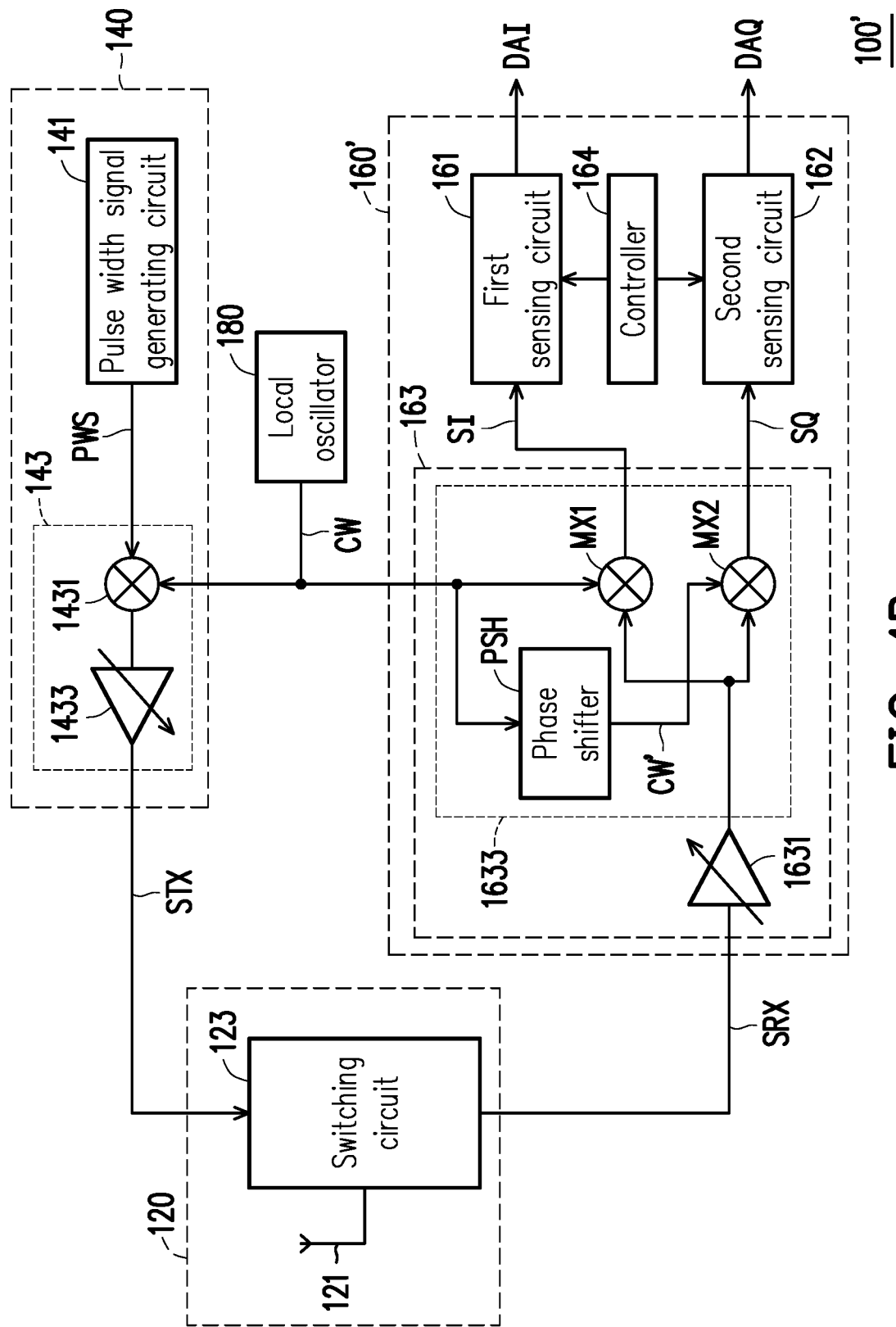
FIG. 4B is a detailed circuit diagram of the ultra-wideband radar transceiver of FIG. 4A according to an embodiment of the disclosure.

FIG. 4A is a circuit block diagram of an ultra-wideband radar transceiver according to another embodiment of the disclosure, and FIG. 4B is a detailed circuit diagram of the ultra-wideband radar transceiver of FIG. 4A according to an embodiment of the disclosure. Referring to FIG. 4A and FIG. 4B together, the ultra-wideband radar transceiver 100' may include an antenna module 120, a transmitting module 140, a receiving module 160', and a local oscillator 180, but is not limited thereto.

The antenna module 120 may be implemented by using various types of antenna modules. In an embodiment of the disclosure, as shown in FIG. 4B, the antenna module 120 may include an antenna 121 and a switching circuit 123. The switching circuit 123 is coupled to the transmitting module 140, the receiving module 160', and the antenna 121. The switching circuit 123 may be switched to electrically connect the transmitting module 140 or the receiving module 160' to the antenna 121, so that the transmitting module 140 may transmit signals in space through the antenna 121, or the receiving module 160' may receive signals from the space through the antenna 121.

The local oscillator 180 is configured to generate a carrier signal CW. In an embodiment of the disclosure, the local oscillator 180 may be implemented using existing oscillator circuits.

The transmitting module 140 is coupled to the antenna module 120, configured to sequentially transmitting M pulse signals STX to a space through the antenna module 120. In an embodiment of the disclosure, the transmitting module 140 includes a pulse width signal generating circuit 141 and a mixing circuit 143. The pulse width signal generating circuit 141 is configured to generate a pulse width signal PWS. The mixing circuit 143 is coupled to the pulse width signal generating circuit 141 to receive the pulse width signal PWS and coupled to the local oscillator 180 to receive the carrier signal CW. The mixing circuit 143 performs up-conversion on the pulse width signal PWS according to the carrier signal CW to generate M pulse signals STX. In an embodiment of the disclosure, the pulse width signal generating circuit 141 may be implemented by using an existing pulse width signal generator.

In an embodiment of the disclosure, as shown in FIG. 4B, the mixing circuit 143 may include an up-conversion mixer 1431 and a power amplifier (PA) 1433. The up-conversion mixer 1431 is coupled to the pulse width signal generating circuit 141, the local oscillator 180, and the power amplifier 1433. The up-conversion mixer 1431 may perform up-conversion on the pulse width signal PWS according to the carrier signal CW to generate an up-converted signal. The power amplifier 1433 may perform power amplification on the up-converted signal to generate the M pulse signals STX.

The receiving module 160' is coupled to the antenna module 120, configured to sequentially receive through the antenna module 120 the M consecutive echo signals SRX which are M consecutive pulse signals STX respectively varied in space, and accordingly generate the first digital data DAI and the second digital data DAQ respectively, where M is an integer greater than 1. Furthermore, the receiving module 160' includes an I/Q signal generator 163, a first sensing circuit 161, a second sensing circuit 162, and a controller 164, wherein the first sensing circuit 161 and the second sensing circuit 162 are similar to the first sensing circuit 161 and the second sensing circuit 162 of the receiving module 160 shown in FIG. 2, respectively. Therefore, the related descriptions may be referred to, and details are not described herein again.

In an embodiment of the disclosure, as shown in FIG. 4B, the I/Q signal generator 163 may include a low noise amplifier circuit 1631 and a down-conversion mixer 1633. The low noise amplifier circuit 1631 may be configured to amplify the echo signal SRX. The down-conversion mixer 1633 may perform a frequency conversion to convert the amplified echo signal into a low frequency in-phase signal SI and a low frequency quadrature-phase signal SQ.

Furthermore, the down-conversion mixer 1633 may include a first mixer MX1, a second mixer MX2, and a phase shifter PSH. The first mixer MX1 is coupled to the low noise amplifier circuit 1631, the local oscillator 180, and the first sensing circuit 161. The first mixer MX1 performs frequency-conversion on the amplified echo signal according to the carrier signal CW to convert the amplified echo signal into a low-frequency in-phase signal SI. The phase shifter PSH is coupled to the local oscillator 180, configured to shift the phase of the carrier signal CW by 90 degrees to generate a quadrature carrier signal CW'. The second mixer MX2 is coupled to the low noise amplifier circuit 1631, the phase shifter PSH, and the second sensing circuit 162. The second mixer MX2 performs frequency-conversion on the amplified echo signal according to the quadrature carrier signal CW' to convert the amplified echo signal into a low-frequency quadrature-phase signal SQ.

The controller 164 is coupled to the first sensing circuit 161 and the second sensing circuit 162, configured to control operations of each of the first sensing circuit 161 and the second sensing circuit 162. For example, the controller 164 may generate an integral control signal CIS, a reset control signal CRS, and a hold control signal CHS to control the operations of the first integrator circuit 1611 and the second integrator circuit 1621. In an embodiment of the disclosure, the controller 164 may be a hardware, a firmware, or a software or machine executable code stored in the memory and loaded by the microcontroller. If implemented by hardware, the controller 164 may be implemented by a single integrated circuit chip or by multiple circuit chips, but the disclosure is not limited thereto. The plurality of circuit chips or the single integrated circuit chip may be implemented by using an application specific integrated circuit (ASIC), a field programmable gate array (FPGA) or a complex programmable logic device (CPLD). The memory may be, for example, a random-access memory, a read only memory, or a flash memory.

Figure 4C:
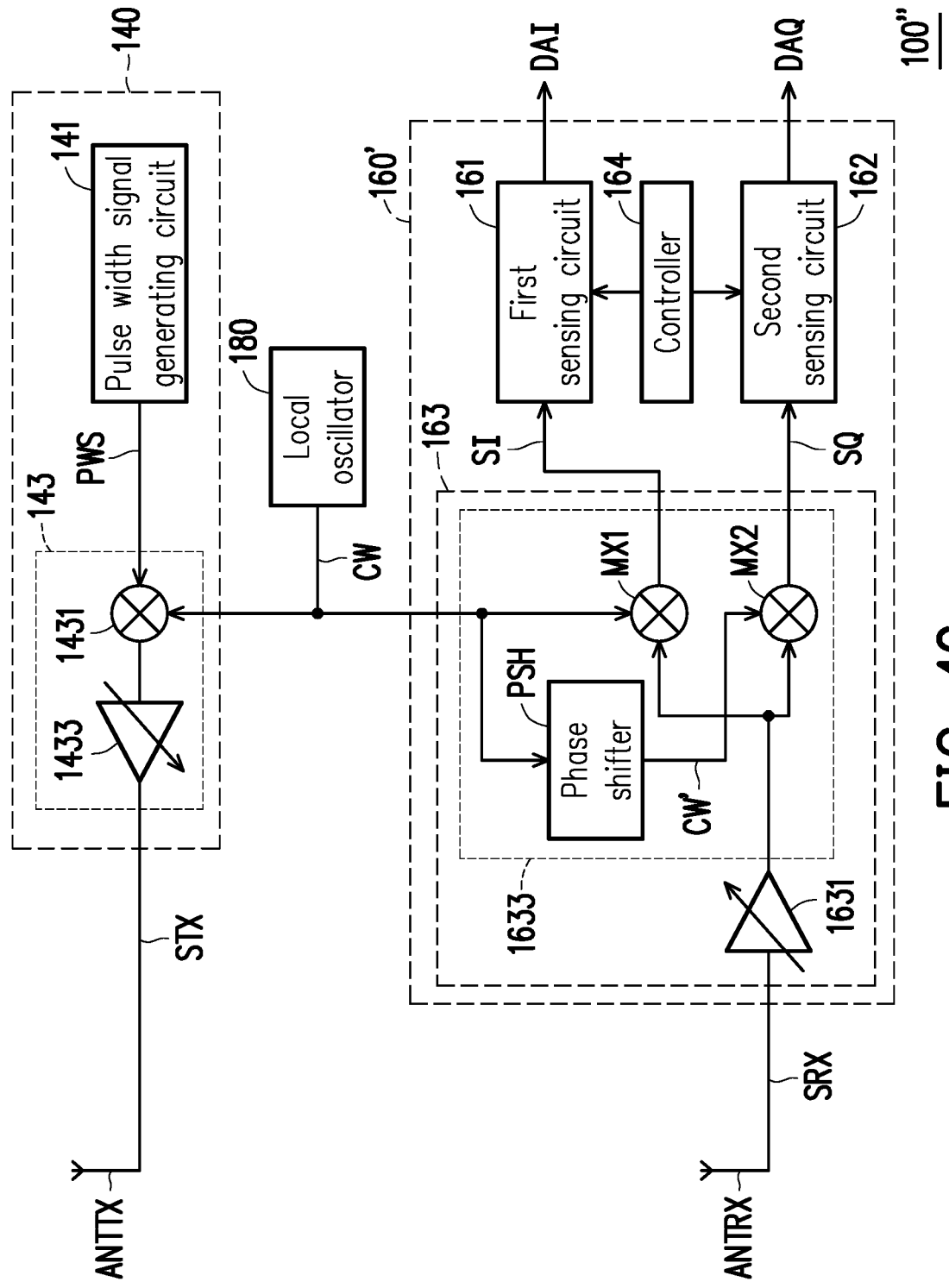
FIG. 4C is a detailed circuit diagram of an ultra-wideband radar transceiver according to another embodiment of the disclosure.

FIG. 4C is a detailed circuit diagram of an ultra-wideband radar transceiver according to another embodiment of the disclosure. Referring to FIG. 4B and FIG. 4C together. The ultra-wideband radar transceiver 100" of FIG. 4C is similar to the ultra-wideband radar transceiver 100' of FIG. 4B. The only difference between the two is that: the transmitting module 140 and the receiving module 160' of FIG. 4B share the antenna 121 through the switching circuit 123, but the transmitting module 140 and the receiving module 160' of FIG. 4C are respectively coupled to corresponding antennas ANTTX and ANTRX. Therefore, the transmitting module 140 of FIG. 4C transmits signals in space through the corresponding antenna ANTTX, and the receiving module 160' of FIG. 4C receives signals from the space through the antenna ANTRX. In addition, reference may be made to the related description of FIG. 4B above for further implementation details of the ultra-wideband radar transceiver 100" of FIG. 4C, and details are not described herein again.

Figure 5:
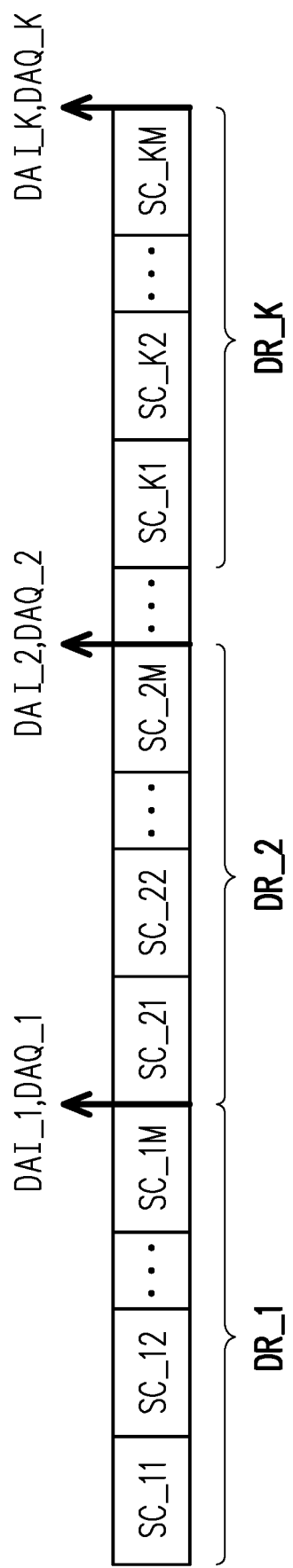
FIG. 5 is a schematic diagram of a detection operation of an ultra-wideband radar transceiver according to an embodiment of the disclosure.

FIG. 5 is a schematic diagram of a detection operation of an ultra-wideband radar transceiver according to an embodiment of the disclosure. Please refer to FIG. 1, FIG. 4A and FIG. 5 hereinafter. The ultra-wideband radar transceiver 100' or 100" may perform consecutive M sensing operations SC_11, SC_12, . . . , SC_1M for the distance location DR_1 to obtain a first digital data DAI_1 and a second digital data DAQ_1 corresponding to the distance location DR_1. The ultra-wideband radar transceiver 100' or 100" may perform consecutive M sensing operations SC_21, SC_22, . . . , SC_2M for the distance location DR_2 to obtain a first digital data DAI_2 and a second digital data DAQ_2 corresponding to the distance location DR_2. By analogy, the ultra-wideband radar transceiver 100' or 100" may perform continuous M sensing operations SC_K1, SC_K2, . . . , SC_KM for the distance location DR_K to obtain a first digital data DAI_K and a second digital data DAQ_K corresponding to the distance location DR_K. However, the disclosure is not limited thereto. In other embodiments of the disclosure, the number of sensing operations carried out for each of the distance locations DR_1~DR_K may also be different depending on actual application or design requirements.

Figure 6:
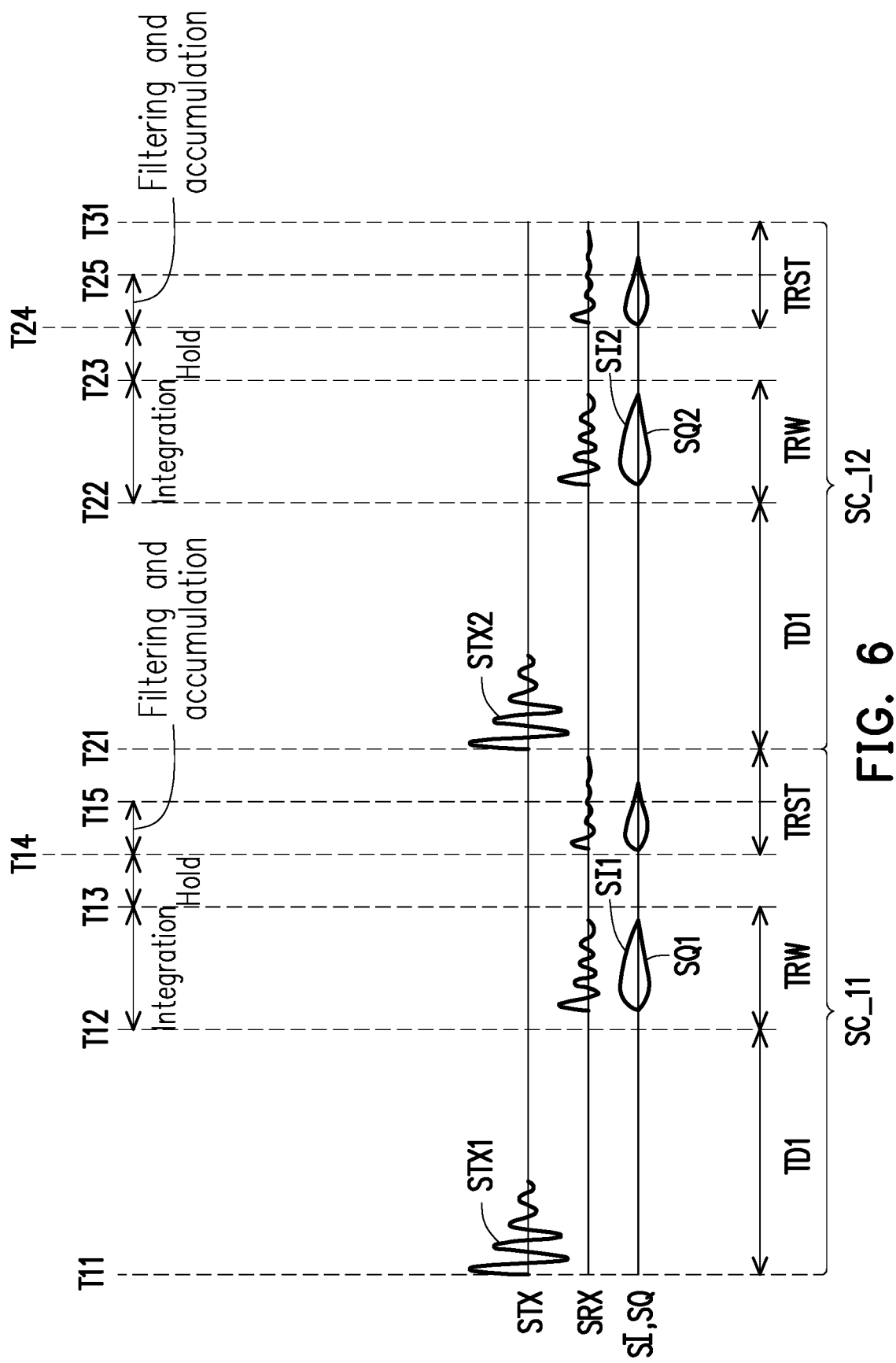
FIG. 6 is a timing diagram of signal processing of an ultra-wideband radar transceiver for two consecutive sensing operations at a distance location according to an embodiment of the disclosure.

The following description will be made by taking two consecutive sensing operations SC_11 and SC_12 at the distance location DR_1 as an example. As for other number sensing operations at the distance location DR_1 or sensing operations at other distance locations DR_2~DR_K, following descriptions may be used. FIG. 6 is a timing diagram of signal processing of an ultra-wideband radar transceiver for two consecutive sensing operations SC_11 and SC_12 at the distance location DR_1 according to an embodiment of the disclosure. Please refer to FIG. 1, FIG. 3A, FIG. 3B, FIG. 3C, FIG. 4A, and FIG. 6 hereinafter. First, at time point T11, the ultra-wideband radar transceiver 100' or 100" starts to carry out the sensing operation SC_11. Therefore, the transmitting module 140 starts transmitting the first pulse signal STX1 of the M pulse signals STX through the antenna module 120. Next, the I/Q signal generator 163 may generate an in-phase signal SI and a quadrature-phase signal SQ according to the received echo signal SRX.

In a preset time interval TRW (i.e., between time points T12 and T13) after the first time length TD1 from the first pulse signal STX1 starts to be transmitted, the controller 164 controls the first integrator circuit 1611 and the second integrator circuit 1621 to receive the in-phase signal SI1 (i.e., the first in-phase signal of the M in-phase signals SI) and the quadrature-phase signal SQ1 (i.e., the first quadrature-phase signal of the M quadrature-phase signals SQ) in the preset time interval TRW, respectively. The first integrator circuit 1611 and the second integrator circuit 1621 respectively performs integration on the in-phase signal SI1 and the quadrature-phase signal SQ1 in the preset time interval TRW (i.e., the switch SW1 is shorted by the integral control signal CIS, the switch SW2 is opened by the reset control signal CRS, and the switch SW3 is opened by the hold control signal CHS) to generate the first one of the M first integrated signals SH0-I and the first one of the M second integrated signals SH0-Q. Between the time point T13 and the time point T14, the controller 164 controls the first integrator circuit 1611 and the second integrator circuit 1621 to hold the first one of the first integrated signals SH0-I and the first one of the second integrated signals SH0-Q (i.e., the switch SW1 is opened by the integral control signal CIS, the switch SW2 is opened by the reset control signal CRS, and the switch SW3 is opened by the hold control signal CHS). Between the time point T14 and the time point T15, the controller 164 controls the first integrator circuit 1611 and the second integrator circuit 1621 to output the first one of the first integrated signals SH0-I and the first one of the second integrated signals SH0-Q to the first low-pass filter circuit 1615 and the second low-pass filter circuit 1625 respectively (i.e., the switch SW1 is opened by the integral control signal CIS, the switch SW2 is opened by the reset control signal CRS, and the switch SW3 is shorted by the hold control signal CHS), so that the first low-pass filter circuit 1615 performs filtering and accumulation on the first one of the first integrated signals SH0-I, and the second low-pass filter circuit 1625 performs filtering and accumulation on the first one of the second integrated signals SH0-Q (as will be described later, this filtering and signal accumulation action will operate on the M consecutive echo signals to generate a last signal, may be voltage or current, outputted to the analog-to-digital conversion circuit). In addition to this, in the reset time interval TRST (i.e., between the time point T14 and the time point T21), the controller 164 resets the first integrator circuit 1611 and the second integrator circuit 1621. Incidentally, the time point T15 at which the low-pass filtering and the signal accumulation are completed may be before the time point T21, or equal to the time point T21, or after the time point T21, depending on the actual application.

At time point T21, the ultra-wideband radar transceiver 100' or 100" starts to perform the sensing operation SC_12. Therefore, the transmitting module 140 transmits the second pulse signal STX2 of the M pulse signals STX through the antenna module 120. Next, the I/Q signal generator 163 may generate an in-phase signal SI and a quadrature-phase signal SQ according to the received echo signal SRX.

In a preset time interval TRW (i.e., between the time points T22 and T23) after the first time length TD1 from the second pulse signal STX2 starts to be transmitted, the controller 164 controls the first integrator circuit 1611 and the second integrator circuit 1621 to receive the in-phase signal SI2 (i.e., the second in-phase signal of the M in-phase signals SI) and the quadrature-phase signal SQ2 (i.e., the second quadrature-phase signal of the M quadrature-phase signals SQ) in the preset time interval TRW, respectively. The first integrator circuit 1611 and the second integrator circuit 1621 respectively perform integration on the in-phase signal SI2 and the quadrature-phase signal SQ2 in the preset time interval TRW to generate a second one of the M first integrated signals SH0-I and the second one of the M second integrated signals SH0-Q. Between the time point T23 and the time point T24, the controller 164 controls the first integrator circuit 1611 and the second integrator circuit 1621 to hold the second one of the first integrated signals SH0-I and the second one of the second integrated signals SH0-Q. Between the time point T24 and the time point T25, the controller 164 controls the first integrator circuit 1611 and the second integrator circuit 1621 to output the second one of the first integrated signals SH0-I and the second one of the second integrated signals SH0-Q to the first low-pass filter circuit 1615 and the second low-pass filter circuit 1625 respectively, so that the first low-pass filter circuit 1615 performs filtering and accumulation on the second one of the first integrated signals SH0-I, and the second low-pass filter circuit 1625 performs filtering and accumulation on the second one of the second integrated signals SH0-Q. In addition to this, in the reset time interval TRST (i.e., between the time point T24 and the time point T31), the controller 164 resets the first integrator circuit 1611 and the second integrator circuit 1621. The short-circuit/open-circuit state of the switches SW1, SW2, and SW3, and the details of the operating method have been described in detail in the foregoing embodiment regarding the sensing operation SC_11 and will not be described below.

It may be understood that, in the sensing operation SC_1M, the first integrator circuit 1611 and the second integrator circuit 1621 may respectively generate the Mth first integrated signal of the M first integrated signals SH0-I and the Mth second integrated signal of the M second integrated signal SH0-Q, and respectively output the Mth first integrated signal and the Mth second integrated signal to the first low-pass filter circuit 1615 and the second low-pass filter circuit 1625.

In addition, the controller 164 may control the first low-pass filter circuit 1615 to sequentially accumulate the M first integrated signals SH0-I to generate the first filtered signal SH1-I, and the controller 164 may control the second low-pass filter circuit 1625 sequentially accumulates the M second integrated signals SH0-Q to generate a second filtered signal SH1-Q. Next, the controller 164 may control the first analog-to-digital conversion circuit 1619 to perform an analog-to-digital conversion on the first filtered signal SH1-I to obtain a first digital data DAI corresponding to the distance location DR_1. Similarly, the controller 164 may control the second analog-to-digital conversion circuit 1629 to perform an analog-to-digital conversion on the second filtered signal SH1-Q to obtain a second digital data DAQ corresponding to the distance location DR_1.

It is worth mentioning that, in FIG. 6, the time point T12 (or T22) at which the first integrator circuit 1611 starts to perform integration on the in-phase signal SI1 and the second integrator circuit 1621 starts to perform integration on the quadrature-phase signal SQ1 is related to the distance from the ultra-wideband radar transceiver 100' or 100" to the distance location DR_1, and the relationship is as shown in the equation (1), where R1 is the distance from the ultra-wideband radar transceiver 100' or 100" to the distance DR_1, and C is the speed of the radar wave, which is the speed of light.

$$2 \times R1 \div C = TD1 + (TRW \div 2) \qquad \text{equation (1)}$$

It may be understood that by adjusting the first-time length TD1, the first integrated signal and the second integrated signal corresponding to different distance locations may be obtained. In other words, the ultra-wideband radar transceiver 100' or 100" may obtain first digital data DAI and second digital data DAQ corresponding to different distance locations within a specific distance range 900 according to different first-time lengths (TD1).

In an embodiment of the disclosure, each of the first low-pass filter circuit 1615 of FIG. 3A and the second low-pass filter circuit 1625 of FIG. 3B may be an active or passive switch capacitor circuit. For example, a programmable discrete-time low-pass filter implemented by a passive switch capacitor, including a finite impulse response filter (FIR filter). The above programmable discrete time low-pass filter circuit may control the corresponding low-pass filter bandwidth by switching different capacitance values. In particular, the controller 164 may adjust the filter bandwidth in the first low-pass filter circuit 1615 according to the first-time length TD1 or the number of sensing operations (i.e., the M value) to perform low-pass filtering and signal accumulation on the M first integrated signals SH0-I to generate the first filtered signal SH1-I. Similarly, the controller 164 may adjust the filter bandwidth in the second low-pass filter circuit 1625 according to the first-time length TD1 or the number of sensing operations (i.e., the M value) to perform low-pass filtering and signal accumulation on the M second integrated signals SH0-Q to generate the second filtered signal SH1-Q.

Furthermore, if the first time length TD1 is longer or the number of sensing operations is more, the first analog-to-digital conversion circuit 1619 and the second analog-to-digital conversion circuit 1629 are required to carry out an analog-to-digital conversion less frequently, the controller 164 may adjust the bandwidth of the first low-pass filter circuit 1615 to a narrower bandwidth to perform low-pass filtering and signal accumulation on the M first integrated signals SH0-I, and may adjust the bandwidth of the second low-pass filter circuit 1625 to a narrower bandwidth to perform low-pass filtering and signal accumulation on the M second integrated signals SH0-Q to suppress aliasing. In contrast, if the first time length TD1 is shorter or the number of sensing operations is less, the first analog-to-digital conversion circuit 1619 and the second analog-to-digital conversion circuit 1629 are required to carry out an analog-to-digital conversion more frequently, the controller 164 may adjust the bandwidth of the first low-pass filter circuit 1615 to a wider bandwidth to perform low-pass filtering and signal accumulation on the M first integrated signals SH0-I, and may adjust the bandwidth of the second low-pass filter circuit 1625 to a wider bandwidth to perform low-pass filtering and signal accumulation on the M second integrated signals SH0-Q.

In an embodiment of the disclosure, in order to increase the operation speed and efficiency of the ultra-wideband radar transceiver 100' or 100", the controller 164 may pipeline the operations of a first integrator circuit 1611 and a first low-pass filter circuit 1615 of FIG. 3A, and pipeline the operations of a second integrator circuit 1621 and a second low-pass filter circuit 1625 of FIG. 3B. In detail, when the first low-pass filter circuit 1615 performs low-pass filtering and signal accumulation on an Lth first integrated signal of the M first integrated signals SH0-I, and when the second low-pass filter circuit 1625 performs low-pass filtering and signal accumulation on the Lth second integrated signal of the second integrated signal SH0-Q, the first integrator circuit 1611 performs integration on a (L+1)th in-phase signal of the M in-phase signals SI in the preset time interval TRW and performs holding on a (L+1)th first integrated signal (SH0-I) of the M first integrated signals (SH0-I), and the second integrator circuit 1621 performs integration on a (L+1)th quadrature-phase signal of the M quadrature-phase signals SQ in the preset time interval TRW and performs holding on a (L+1)th second integrated signal (SH0-I) of the M second integrated signals (SH0-Q), where L is an integer greater than 1 and less than M.

Figure 7:
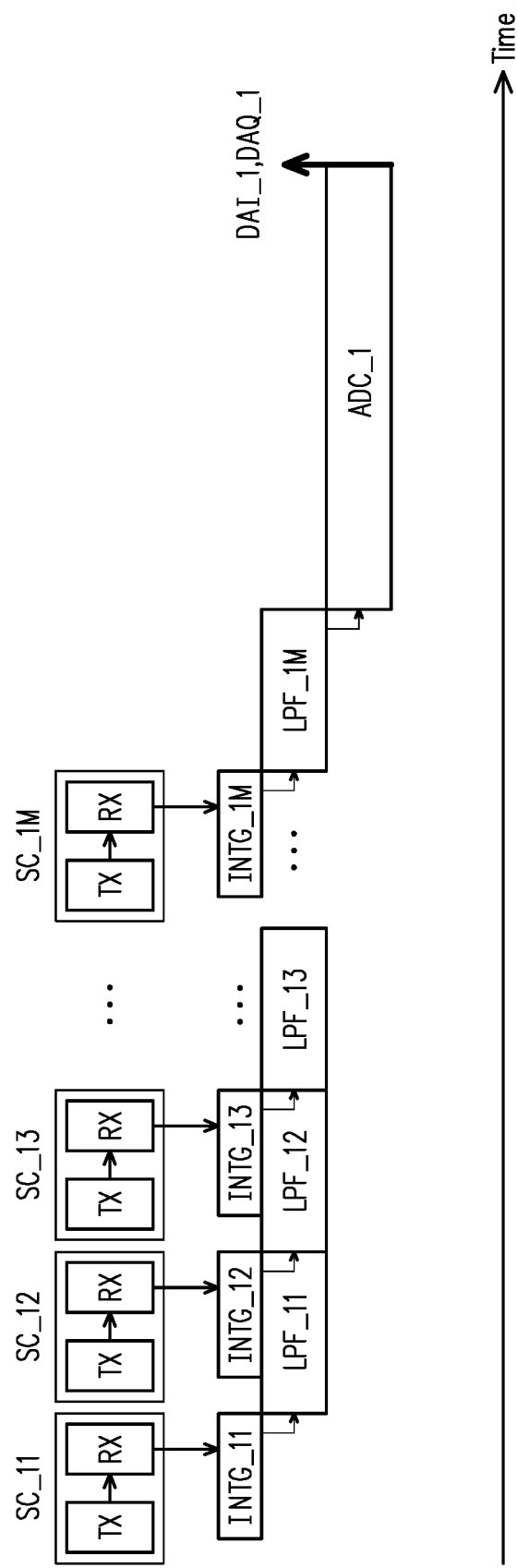
FIG. 7 is a schematic diagram showing the pipeline operation of an ultra-wideband radar transceiver according to an embodiment of the disclosure.

For example, FIG. 7 is a schematic diagram showing the pipeline operation of an ultra-wideband radar transceiver according to an embodiment of the disclosure. For the sake of simplicity of the drawing, in the M sensing operations SC_11, SC_12, . . . , SC_1M shown in FIG. 7, stage Tx represents a stage which the transmitting module 140 of FIG. 4A transmits the pulse signal STX, and stage Rx represents a stage which the I/Q signal generator 163 of FIG. 4A receives the corresponding echo signal SRX and accordingly generates an in-phase signal SI and a quadrature-phase signal SQ. In addition, stages INTG_11, INTG_12, INTG_13, . . . , INTG_1M respectively represent stages which the first integrator circuit 1611 and the second integrator circuit 1621 perform integration and hold processing on the in-phase signal SI and the quadrature-phase signal SQ in the M sensing operations SC_11, SC_12, . . . , SC_1M respectively, and the stages LPF_11, LPF_12, LPF_13, . . . , LPF_1M respectively represent stages which the first low-pass filter circuit 1615 and the second low-pass filter circuit 1625 carry out low-pass filtering and signal accumulation in the M sensing operations SC_11, SC_12, . . . , SC_1M. The stage ADC_1 represents a stage which the first analog-to-digital conversion circuit 1619 and the second analog-to-digital conversion circuit 1629 carry out an analog-to-digital conversion operation to generate the first digital data DAI_1 and the second digital data DAQ_1 respectively.

Referring to FIG. 3A, FIG. 3B, FIG. 4A, FIG. 4B, FIG. 4C and FIG. 7 together, when the first low-pass filter circuit 1615 performs low-pass filtering and signal accumulation on the first one of the first integrated signals SH0-I, and when the second low-pass filter circuit 1625 performs low-pass filtering and signal accumulation on the first one of the second integrated signal SH0-Q (i.e., as shown in the stage LPF_11 of FIG. 7), the transmitting module 140 transmits a second pulse signal STX, and the I/Q signal generator 163 receives the echo signal SRX corresponding to the second pulse signal STX and generates a second in-phase signal SI and a second quadrature-phase signal SQ (i.e., as shown stages Tx and Rx in the sensing operation SC_12 of FIG. 7). The first integrator circuit 1611 performs integration on the second in-phase signal SI in the preset time interval TRW and holds on the second one of the first integrated signals SH0-I, and the second integrator circuit 1621 performs integration on the second quadrature-phase signal SQ in the preset time interval TRW and holds the second one of the second integrated signal SH0-Q (as shown in the stage INTG_12 of FIG. 7).

Figure 8:
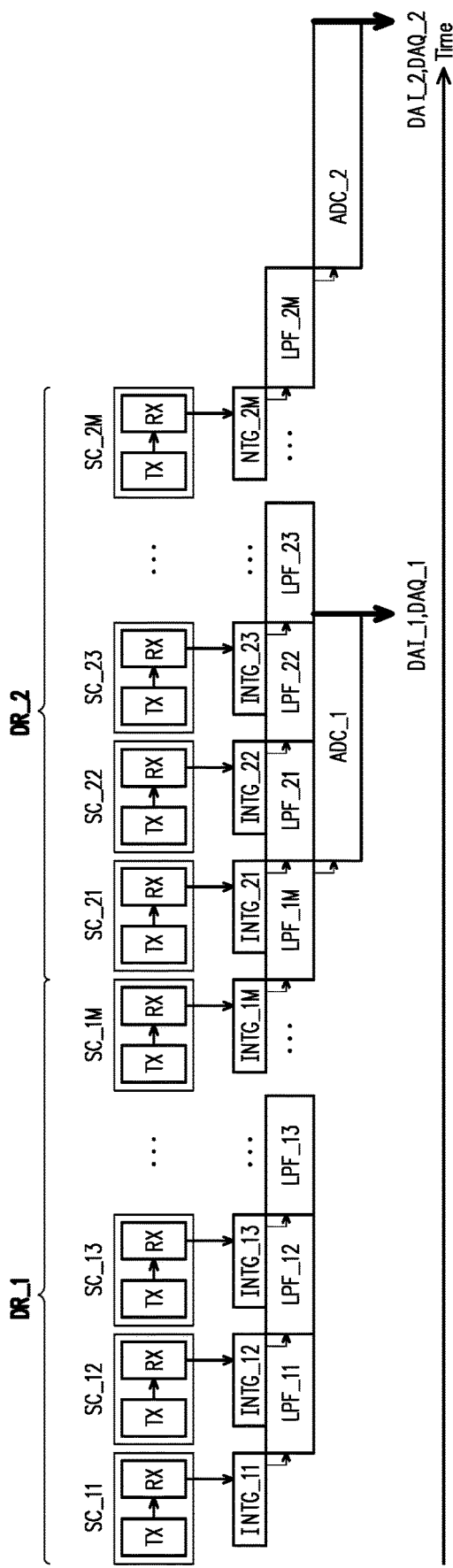
FIG. 8 is a schematic diagram showing the pipeline operation of an ultra-wideband radar transceiver according to another embodiment of the disclosure.

In another embodiment of the disclosure, to speed up the operation and efficiency of the ultra-wideband radar transceiver 100' or 100", the controller 164 may pipeline the detection operations at adjacent distance locations in FIG. 5. FIG. 8 is a schematic diagram showing the pipeline operation of an ultra-wideband radar transceiver according to another embodiment of the disclosure. The operations represented by stage Tx, stage Rx, stages INTG_11, INTG_12, INTG_13, . . . , INTG_1M, stages LPF_11, LPF_12, LPF_13, . . . , LPF_1M, and stage ADC_1 of FIG. 8 are similar to those of FIG. 7, thus correlated description of FIG. 7 above may be considered. In addition, in the sensing operation of the distance location DR_2 of FIG. 8, the stages INTG_21, INTG_22, INTG_23, . . . , INTG_2M respectively represent stages which the first integrator circuit 1611 and the second integrator circuit 1621 performs integration and holds the in-phase signal SI and the quadrature-phase signal SQ respectively in the M sensing operations SC_21, SC_22, . . . , SC_2M. The stages LPF_21, LPF_22, LPF_23, . . . , LPF_2M respectively represent stages which the first low-pass filter circuit 1615 and the second low-pass filter circuit 1625 carry out filtering and signal accumulation in the M sensing operations SC_21, SC_22, . . . , SC_2M, and the stage ADC_2 represents a stage which the first analog-to-digital conversion circuit 1619 and the second analog-to-digital conversion circuit 1629 carry out an analog-to-digital conversion to generate first digital data DAI_2 and second digital data DAQ_2 corresponding to the distance location DR_2.

Please refer to FIG. 3A, FIG. 3B, FIG. 4A, FIG. 4B, FIG. 4C and FIG. 8 together, when the first low-pass filter circuit 1615 performs signal accumulation on the last one of the first integrated signals SH0-I for the first distance location DR_1, and when the second low-pass filter circuit performs signal accumulation on the last one of the second integrated signals SH0-Q for the first distance location DR_1 (i.e., as shown in the stage LPF_1M of FIG. 8), the transmitting module 140 sends a first pulse signal STX configured to detect the second distance location DR_2, the I/Q signal generator 163 receives the echo signal SRX corresponding to the first pulse signal STX and accordingly generates a first in-phase signal SI and a first quadrature-phase signal SQ of the second distance location DR_2 (i.e. as shown by stages Tx and Rx in the sensing operation SC_21 of FIG. 8), the first integrator circuit 1611 performs integration on the first in-phase signal SI of the second distance location DR_2 in the preset time interval TRW and performs a hold on the first one of the first integrated signals SH0-I of the second distance location DR_2, and the second integrator circuit 1621 performs integration on the first quadrature-phase signal SQ of the second distance location DR_2 in the preset time interval TRW and performs a hold on the first one of the second integrated signals SH0-Q of the second distance location DR_2 (i.e., as shown by the stage INTG_21 of FIG. 8).

In addition, when the first analog-to-digital conversion circuit 1619 performs an analog-to-digital conversion on the first filtered signal SH1-I of the first distance location DR_1, and when the second analog-to-digital conversion circuit 1629 performs an analog-to-digital conversion on the second filtered signal SH1-Q of the first distance location DR_1 (i.e., as shown by stage ADC_1 in FIG. 8), the first low-pass filter circuit 1615 performs signal accumulation on at least a part of the M first integrated signals SH0-I at the second distance location DR_2, and the second low-pass filter circuit 1625 performs signal accumulation on at least part of the M second integrated signals SH0-Q at the second distance location DR_2 (i.e., as shown by stages INTG_22 and INTG_23 of FIG. 8).

Figure 9:
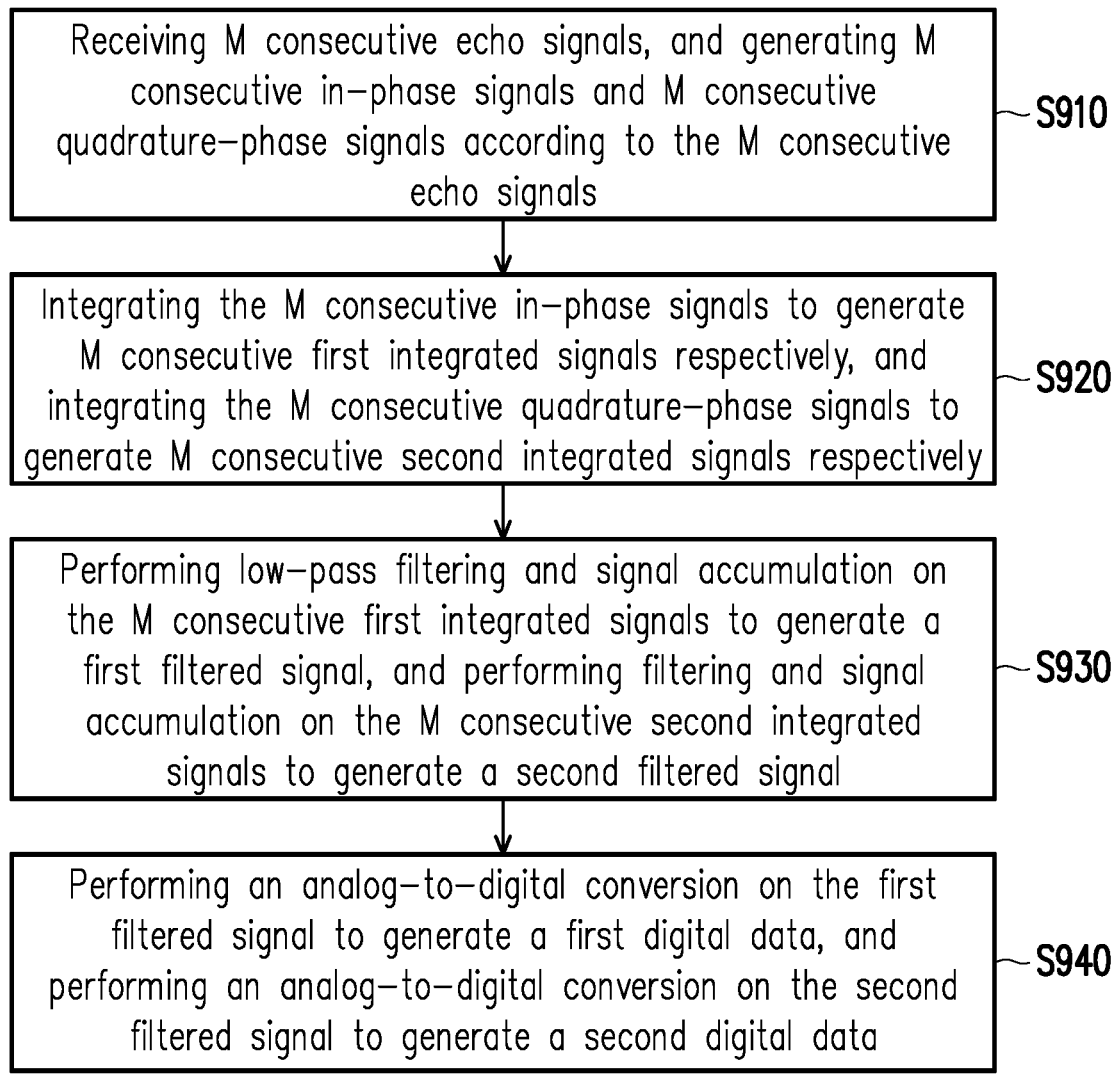
FIG. 9 is a flowchart showing the steps of an operating method of an ultra-wideband radar transceiver according to an embodiment of the disclosure.

FIG. 9 is a flowchart showing the steps of an operating method of an ultra-wideband radar transceiver according to an embodiment of the disclosure, which may be applied to the ultra-wideband radar transceiver 100 shown in FIG. 2 or the ultra-wideband radar transceiver 100' shown in FIG. 4A but is not limited to this. Referring to FIG. 4A and FIG. 9 together, the operating method of the ultra-wideband radar transceiver includes the following steps. First, in step S910, M consecutive echo signals SRX are received, and M consecutive in-phase signals SI and M consecutive quadrature-phase signals SQ are generated according to M consecutive echo signals SRX. Next, in step S920, integration is performed on M consecutive in-phase signals SI to generate M consecutive first integrated signals SH0-I respectively, and integration is performed on the M consecutive quadrature-phase signals SQ to generate M consecutive second integrated signals SH0-Q respectively. Then, in step S930, low-pass filtering and signal accumulation are performed on the M consecutive first integrated signals SH0-I to generate a first filtered signal SH1-I, and filtering and signal accumulation are performed on M consecutive second integrated signals SH0-Q to generate a second filtered signal SH1-Q. Then, in step S940, an analog-to-digital conversion is performed on the first filtered signal SH1-I to generate a first digital data DAI, and an analog-to-digital conversion is performed on the second filtered signal SH1-Q to generate a second digital data DAQ. Details of the operating method of the ultra-wideband radar transceiver according to the embodiment of the disclosure have been described in detail in the foregoing embodiments and are not described in detail below.

In summary, the ultra-wideband radar transceiver and operating method thereof according to the embodiments of the disclosure is to perform integration, low-pass filtering and signal accumulation on multiple consecutive in-phase signals, and perform integration, low-pass filtering and signal accumulation on multiple consecutive quadrature-phase signals, then to convert into a first digital data and a second digital data by analog-to-digital converters respectively. The method may effectively reduce the difficulty of digitizing echo signals, reduce power consumption and cost associated with the use of extremely high-speed analog-to-digital converter, suppress the noise in the signal of the analog-to-digital converter by continuous low-pass filtering and signal accumulation. In addition, the ultra-wideband radar transceiver and the operating method thereof according to the embodiments of the disclosure not only pipeline the integration and hold operation with low-pass filter and signal accumulation operation, but also pipeline detection operations at adjacent distance locations to speed up the operation and efficiency of ultra-wideband radar transceiver.

The disclosure has been disclosed in the above embodiments, but it is not intended to limit the disclosure, and those skilled in the art may make a few changes without departing from the spirit and scope of the disclosure. The scope of protection of the disclosure is defined by the scope of the appended claims.

What is claimed is:

1. An ultra-wideband radar transceiver, configured to detect spatial information within a specific distance range, the ultra-wideband radar transceiver comprising:
    a receiving module, configured to receive M consecutive echo signals, and respectively generating a first digital data and a second digital data accordingly, wherein M is an integer greater than 1, and the receiving module comprising:
    an I/Q signal generator, configured to generate M consecutive in-phase signals and M consecutive quadrature-phase signals according to the M consecutive echo signals;
    a first sensing circuit, coupled to the I/Q signal generator to receive the M consecutive in-phase signals, and configured to perform integration and an analog-to-digital conversion on the M consecutive in-phase signals to generate the first digital data; and
    a second sensing circuit, coupled to the I/Q signal generator to receive the M consecutive quadrature-phase signals, and configured to perform integration and an analog-to-digital conversion on the M consecutive quadrature-phase signals to generate the second digital data;
    wherein the first sensing circuit comprises:
    a first integrator circuit, configured to perform integration on the M consecutive in-phase signals to respectively generate M consecutive first integrated signals;
    a first low-pass filter circuit, coupled to the first integrator circuit to receive the M consecutive first integrated signals, and performing filtering and signal accumulation on the M consecutive first integrated signals to generate a first filtered signal; and a first analog-to-digital conversion circuit, coupled to the first low-pass filter circuit to receive the first filtered signal, and performing an analog-to-digital conversion on the first filtered signal to generate the first digital data;

wherein the second sensing circuit comprises:

a second integrator circuit, configured to perform integration on the M consecutive quadrature-phase signals to respectively generate M consecutive second integrated signals;

a second low-pass filter circuit, coupled to the second integrator circuit to receive the M consecutive second integrated signals, and performing filtering and accumulation on the M consecutive second integrated signals to generate a second filtered signal; and a second analog-to-digital conversion circuit coupled to the second low-pass filter circuit to receive the second filtered signal, and performing an analog-to-digital conversion on the second filtered signal to generate the second digital data;

wherein the first digital data and the second digital data are related to the spatial information;

wherein the receiving module further comprises:

a controller, coupled to the first sensing circuit and the second sensing circuit, configured to control operations of each of the first sensing circuit and the second sensing circuit;

wherein the ultra-wideband radar transceiver further comprises:

an antenna module; and a transmitting module, coupled to the antenna module, configured to sequentially transmitting M consecutive pulse signals in space through the antenna module;

wherein the receiving module is coupled to the antenna module, configured to sequentially receive the M consecutive echo signals which are the M consecutive pulse signals respectively varied in space through the antenna module;

wherein the ultra-wideband radar transceiver:

in a preset time interval after a first time length from a Nth pulse signal of the M consecutive pulse signals starts to be transmitted, the controller controls the first integrator circuit and the second integrator circuit to respectively receive a Nth in-phase signal of the M consecutive in-phase signals and a Nth quadrature-phase signal of the M consecutive quadrature-phase signals in the preset time interval, and the first integrator circuit and the second integrator circuit respectively perform integration on the Nth in-phase signal and the Nth quadrature-phase signal in the preset time generate a Nth first integrated signal of the M consecutive first integrated signals and a Nth second integrated signal of the M consecutive second integrated signals, to respectively perform a hold on the Nth first integrated signal and the Nth second integrated signal, and to respectively output the Nth first integrated signal and the Nth second integrated signal to the first low-pass filter circuit and the second low-pass filter circuit, wherein N is an integer greater than 1 and less than or equal to M;

the controller controls the first low-pass filter circuit to sequentially accumulate the M consecutive first integrated signals to generate the first filtered signal, and the controller controls the second low-pass filter circuit to sequentially accumulate the M consecutive second integrated signals to generate the second filtered signal.

2. The ultra-wideband radar transceiver according to claim 1, wherein the controller resets the first integrator circuit and the second integrator circuit outside the preset time interval.

3. The ultra-wideband radar transceiver according to claim 1, wherein the ultra-wideband radar transceiver obtains the first digital data and the second digital data corresponding to different distance locations within the specific distance range according to different first-time lengths.

4. The ultra-wideband radar transceiver according to claim 1, wherein:

when the first low-pass filter circuit performs signal accumulation on a Lth first integrated signal of the M consecutive first integrated signals and the second low-pass filter circuit performs signal accumulation on a Lth second integrated signal of the M consecutive second integrated signals, the first integrator circuit performs integration on a (L+1)th in-phase signal of the M consecutive in-phase signals in the preset time interval and performs a hold on a (L+1)th first integrated signal of the M consecutive first integrated signals, and the second integrator circuit performs integration on a (L+1)th quadrature-phase signal of the M consecutive quadrature-phase signals in the preset time interval and performs a hold on a (L+1)th second integrated signal of the M consecutive second integrated signals, where L is an integer greater than 1 and less than M.

5. The ultra-wideband radar transceiver according to claim 4, wherein:

the specific distance range comprises a first distance location and a second distance location, and when the first low-pass filter circuit performs signal accumulation on a last first integrated signal of the M consecutive first integrated signals at the first distance location and the second low-pass filter circuit performs signal accumulation on a last second integrated signal of the M consecutive second integrated signals at the first distance location, the first integrator circuit performs integration on a first in-phase signal of the M consecutive in-phase signals in the preset time interval at the second distance location and performs a hold on a first one of the M consecutive first integrated signals at the second distance location, and the second integrator circuit performs integration on a first quadrature-phase signal of the M consecutive quadrature-phase signals in the preset time interval at the second distance location and performs a hold on a first one of the M consecutive second integrated signals at the second distance location.

6. The ultra-wideband radar transceiver according to claim 5, wherein:

when the first analog-to-digital conversion circuit performs an analog-to-digital conversion on the first filtered signal at the first distance location and the second analog-to-digital conversion circuit performs an analog-to-digital conversion on the second filtered signal at the first distance location, the first low-pass filter circuit performs signal accumulation on at least a part of the M consecutive first integrated signals at the second distance location and the second low-pass filter circuit performs signal accumulation on at least a part of the M consecutive second integrated signals at the second distance location.

7. The ultra-wideband radar transceiver according to claim 1, wherein each of the first low-pass filter circuit and the second low-pass filter circuit is a programmable discrete time low-pass filter circuit, wherein the controller adjusts a low-pass filter bandwidth of the first low-pass filter circuit according to the first time length, and the first low-pass filter circuit performs filtering and signal accumulation on the M consecutive first integrated signals to generate the first filtered signal, wherein the controller adjusts a low-pass filter bandwidth of the second low-pass filter circuit according to the first time length, and the second low-pass filter circuit performs filtering and signal accumulation on the M consecutive second integrated signals to generate the second filtered signal.

8. The ultra-wideband radar transceiver according to claim 1, further comprising:
a local oscillator, coupled to the I/Q signal generator, and configured to generate a carrier signal,
wherein the I/Q signal generator performs down-conversion on the M consecutive echo signals according to the carrier signal to generate the M consecutive in-phase signals and the M consecutive quadrature-phase signals,
wherein the transmitting module comprises:
a pulse width signal generating circuit, configured to generate a pulse width signal; and
a mixing circuit, coupled to the pulse width signal generating circuit to receive the pulse width signal and coupled to the local oscillator to receive the carrier signal, wherein the mixing circuit performs up-conversion on the pulse width signal according to the carrier signal to generate the M consecutive pulse signals.

9. An operating method of an ultra-wideband radar transceiver, configured to detect spatial information within a specific distance range, the operating method comprising:
receiving M consecutive echo signals, and generating M consecutive in-phase signals and M consecutive quadrature-phase signals according to the M consecutive echo signals;
performing integration on the M consecutive in-phase signals to generate M consecutive first integrated signals respectively, and performing integration on the M consecutive quadrature-phase signals to generate M consecutive second integrated signals respectively;
performing filtering and signal accumulation on the M consecutive first integrated signals to generate a first filtered signal, and performing filtering and signal accumulation on the M consecutive second integrated signals to generate a second filtered signal; and
performing an analog-to-digital conversion on the first filtered signal to generate a first digital data, and performing an analog-to-digital conversion on the second, filtered signal to generate a second digital data, wherein M is an integer greater than 1;
wherein, the first digital data and the second digital data are related to the spatial information;
wherein the step of performing integration on the M consecutive in-phase signals to generate the M consecutive first integrated signals respectively comprises:
obtaining a Nth in-phase signal of M consecutive in-phase signals in a preset time interval after a first-time length from a Nth pulse signal of the M consecutive pulse signals starts to be transmitted; and
performing integration on the Nth in-phase signal in the preset time interval to generate a Nth first integrated signal of the M first integrated signals, and performing a hold on the Nth first integrated signal, wherein N is an integer greater than 1 and less than or equal to M,
wherein the step of performing integration on the M consecutive quadrature-phase signals to generate the M consecutive second integrated signals respectively comprises:
obtaining a Nth quadrature-phase signal of the M consecutive quadrature-phase signals in a preset time interval after a first-time length from the Nth pulse signal of the M consecutive pulse signals starts to be transmitted; and
performing integration on the Nth quadrature-phase signal in the preset time interval to generate a Nth second integrated signal of the M consecutive second integrated signals and performing a hold on the Nth second integrated signal.

10. The operating method of the ultra-wideband radar transceiver according to claim 9, wherein the specific distance range comprises a first distance location, and a time point at which integration on the M consecutive in-phase signals is starting to be performed and the time point at which integration on the M consecutive quadrature-phase signals is starting to be performed are related to a distance from the ultra-wideband radar transceiver to the first distance location.

11. The operating method of the ultra-wideband radar transceiver according to claim 9, wherein the step of receiving M consecutive echo signals comprises:
sequentially transmitting M consecutive pulse signals in space; and
sequentially receiving the M consecutive echo signals which are the M consecutive pulse signals respectively varied in space.

12. The operating method of the ultra-wideband radar transceiver according to claim 9, wherein
obtaining the first digital data and the second digital data corresponding to different distance locations within the specific distance range according to different first-time lengths.

13. The operating method of the ultra-wideband radar transceiver according to claim 9, wherein:
when signal accumulation on a Lth first integrated signal of the M first integrated signals is performed and signal accumulation on a Lth second integrated signal of the M second integrated signals is performed, performing integration on a (L+1)th in-phase signal of the M in-phase signals in the preset time interval and performing a hold on a (L+1)th first integrated signal of the M first integrated signals, and performing integration on a (L+1)th quadrature-phase signal of the M quadrature-phase signals in the preset time interval and performing a hold on a (L+1)th second integrated signal of the M second integrated signals, wherein L is an integer greater than 1 and less than M.

14. The operating method of the ultra-wideband radar transceiver according to claim 9, wherein:
the specific distance range comprises a first distance location and a second distance location, and when signal accumulation is performed on a last one of the M first integrated signals at the first distance location and when signal accumulation is performed on a last one of the M second integrated signals at the first distance location, performing integration on a first in-phase signal of the M consecutive in-phase signals in the preset time interval at the second distance location and performing a hold on a first one of the M first integrated signals at the second distance location, and performing integration on a first quadrature-phase signal of the M consecutive quadrature-phase signals in the preset time interval at the second distance location and performing a hold on a first one of the M consecutive second integrated signals at the second distance location.

15. The operating method of the ultra-wideband radar transceiver according to claim 14, wherein:
when an analog-to-digital conversion is performed on the first filtered signal at the first distance location, and when an analog-to-digital conversion is performed on the second filtered signal at the first distance location, performing signal accumulation on at least a part of the M consecutive first integrated signals at the second distance location and performing signal accumulation on at least a part of the M consecutive second integrated signals at the second distance location.

16. An ultra-wideband radar transceiver, configured to detect spatial information within a specific distance range, the ultra-wideband radar transceiver comprising:
a receiving module, configured to receive M consecutive echo signals, and respectively generating a first digital data and a second digital data accordingly, wherein M is an integer greater than 1, and the receiving module comprising:
an I/Q signal generator, configured to generate M consecutive in-phase signals and M consecutive quadrature-phase signals according to the M consecutive echo signals;
a first sensing circuit, coupled to the I/Q signal generator to receive the M consecutive in-phase signals, and configured to perform integration and an analog-to-digital conversion on the M consecutive in-phase signals to generate the first digital data; and
a second sensing circuit, coupled to the I/Q signal generator to receive the M consecutive quadrature-phase signals, and configured to perform integration and an analog-to-digital conversion on the M consecutive quadrature-phase signals to generate the second digital data;

wherein the first sensing circuit comprises:
a first integrator circuit, configured to perform integration on the M consecutive in-phase signals to respectively generate M consecutive first integrated signals;
a first low-pass filter circuit, coupled to the first integrator circuit to receive the M consecutive first integrated signals, and performing filtering and signal accumulation on the M consecutive first integrated signals to generate a first filtered signal; and
a first analog-to-digital conversion circuit, coupled to the first low-pass filter circuit to receive the first filtered signal, and performing an analog-to-digital conversion on the first filtered signal to generate the first digital data;
wherein the second sensing circuit comprises:
a second integrator circuit, configured to perform integration on the M consecutive quadrature-phase signals to respectively generate M consecutive second integrated signals;
a second low-pass filter circuit, coupled to the second integrator circuit to receive the M consecutive second integrated signals, and performing filtering and accumulation on the M consecutive second integrated signals to generate a second filtered signal; and
a second analog-to-digital conversion circuit coupled to the second low-pass filter circuit to receive the second filtered signal, and performing an analog-to-digital conversion on the second filtered signal to generate the second digital data;
wherein the first digital data and the second digital data are related to the spatial information;
wherein the specific distance range comprises a first distance location, and a time point at which the first integrator circuit starts to perform integration on the M consecutive in-phase signals and the time point at which the second integrator circuit starts to perform integration on the M consecutive quadrature-phase signals are related to a distance from the ultra-wideband radar transceiver to the first distance location.

* * * * *